United States Patent
Naaman et al.

(10) Patent No.: US 9,509,274 B2
(45) Date of Patent: Nov. 29, 2016

(54) SUPERCONDUCTING PHASE-SHIFT SYSTEM

(71) Applicants: Ofer Naaman, Ellicott City, MD (US); Mohamed Osama Abutaleb, Laurel, MD (US)

(72) Inventors: Ofer Naaman, Ellicott City, MD (US); Mohamed Osama Abutaleb, Laurel, MD (US)

(73) Assignee: Northrop Grumman Systems Corporation, Falls Church, VA (US)

(*) Notice: Subject to any disclaimer, the term of this patent is extended or adjusted under 35 U.S.C. 154(b) by 0 days.

(21) Appl. No.: 14/490,171

(22) Filed: Sep. 18, 2014

(65) Prior Publication Data
US 2016/0087599 A1 Mar. 24, 2016

(51) Int. Cl.
*H01P 1/18* (2006.01)
*H01P 1/20* (2006.01)
*H03H 7/20* (2006.01)
*H01L 39/22* (2006.01)

(52) U.S. Cl.
CPC ........ *H03H 7/20* (2013.01); *H01P 1/18* (2013.01); *H01L 39/223* (2013.01)

(58) Field of Classification Search
CPC .......... H03H 7/07; H03H 7/20; H03K 19/195
USPC ....... 333/138, 139, 140, 170, 171, 174, 99 S; 327/367, 528; 505/210, 866, 874; 324/248
See application file for complete search history.

(56) References Cited

U.S. PATENT DOCUMENTS

| | | | | |
|---|---|---|---|---|
| 3,421,121 A | * | 1/1969 | Burnsweig, Jr. | ......... H03H 7/20 333/171 |
| 3,474,181 A | * | 10/1969 | Ayres | ..................... G10H 1/045 331/106 |
| 5,153,171 A | * | 10/1992 | Smith | ..................... H01P 1/185 333/161 |
| 5,409,889 A | | 4/1995 | Das | |

(Continued)

FOREIGN PATENT DOCUMENTS

EP  0 476 839 A2  3/1992

OTHER PUBLICATIONS

Patzelt et al., High-Temperature Superconductive Lumped-Element Microwave Allpass Sections, Aug. 1993, Electronic Letters, vol. 29 No. 17, 1578-1580.*

(Continued)

*Primary Examiner* — Dean Takaoka
(74) *Attorney, Agent, or Firm* — Tarolli, Sundheim, Covell & Tummino LLP

(57) ABSTRACT

One example includes a superconducting phase-shift system. The system includes an all-pass filter comprising at least one variable inductance element. The all-pass filter can be configured to receive an input signal and to provide the input signal as an output signal that is phase-shifted relative to the input signal based on a variable inductance provided by each of the at least one variable inductance element. The system can further include a phase controller configured to provide a phase-control current to control the variable inductance of the at least one variable inductance element based on a characteristic of the phase-control current.

20 Claims, 4 Drawing Sheets

(56) References Cited

U.S. PATENT DOCUMENTS

| | | | | |
|---|---|---|---|---|
| 5,920,241 | A * | 7/1999 | Mazzochette | H03H 7/19 333/171 |
| 6,438,394 | B1 * | 8/2002 | Zhang | H01P 1/20336 333/168 |
| 6,529,750 | B1 * | 3/2003 | Zhang | H01P 1/20336 333/185 |
| 6,788,169 | B1 * | 9/2004 | Schemmann | H03F 1/32 333/140 |
| 7,095,227 | B2 * | 8/2006 | Tarutani | H03K 19/1954 324/248 |
| 7,276,993 | B2 * | 10/2007 | York | H03H 7/20 333/139 |
| 7,323,955 | B2 * | 1/2008 | Jachowski | H01P 1/2039 327/556 |
| 7,498,832 | B2 | 3/2009 | Baumgardner et al. | |
| 7,714,605 | B2 | 5/2010 | Baumgardner et al. | |
| 7,724,020 | B2 | 5/2010 | Herr | |
| 7,772,871 | B2 | 8/2010 | Herr et al. | |
| 7,772,872 | B2 | 8/2010 | Lewis | |
| 7,782,077 | B2 | 8/2010 | Herr et al. | |
| 7,969,178 | B2 | 6/2011 | Przybysz et al. | |
| 8,098,179 | B2 * | 1/2012 | Bunyk | B82Y 10/00 257/31 |
| 8,169,231 | B2 * | 5/2012 | Berkley | B82Y 10/00 326/1 |
| 8,179,133 | B1 * | 5/2012 | Kornev | G01R 33/0354 324/225 |
| 8,234,103 | B2 * | 7/2012 | Biamonte | B82Y 10/00 703/15 |
| 8,242,799 | B2 | 8/2012 | Pesetski et al. | |
| 8,436,699 | B2 * | 5/2013 | Okubora | H01P 1/2039 333/202 |
| 8,489,163 | B2 | 7/2013 | Herr et al. | |
| 8,542,080 | B2 * | 9/2013 | Podell | H03H 7/19 333/124 |
| 8,654,578 | B2 | 2/2014 | Lewis et al. | |
| 8,928,391 | B2 * | 1/2015 | Naaman | B82Y 10/00 327/367 |
| 8,933,695 | B1 * | 1/2015 | Kornev | G01R 33/0354 324/225 |
| 9,077,309 | B2 * | 7/2015 | Dounaevski | H03H 7/461 |
| 2006/0267709 | A1 | 11/2006 | York | |
| 2008/0119363 | A1 | 5/2008 | Bernstein et al. | |
| 2009/0134953 | A1 * | 5/2009 | Hunt | H01P 1/203 333/168 |
| 2016/0079968 | A1 * | 3/2016 | Strand | H01L 39/2493 327/528 |

OTHER PUBLICATIONS

Kaplunenko, et al.: 2004 *Supercond. Sci. Technol.* 17 S145. doi:10.1088/0953-2048/17/5/011 Received Nov. 19, 2003, Published Feb. 19, 2004. IOP Publishing Ltd.

Rafique, et al.: *Miniaturized Superconducting Microwave Filters*, Superconoductor Science and Technology—IOPscience, http://iopsicence.iop.org/0953-2048/21/7/075004/pdf/0953-2048_21_7_075004.pdf.

Adler, D., & Popovich, R. (Jul. 1991). Broadband switched-bit phase shifter using all-pass networks. In *Microwave Symposium Digest. 1991., IEEE MTT-S International* (pp. 265-268). IEEE.

Applied Superconductivity Conference, ASC 2008, Chicago, IL, USA, Aug. 17-22, 2008, Electronics Abstracts found at: http://www.ascinc.org/asc2008/uploads/2008Abstracts_Electronics.pdf.

Brummer, G., R. Rafique, and T. A. Ohki. "Phase and Amplitude Modulator for Microwave Pulse Generation." *Applied Superconductivity, IEEE Transactions on* 21.3 (2011): 583-586.

Durand, D. J., Carpenter, J., Ladizinsky, E., Lee, L., Jackson, C. M., Silver, A., & Smith, A. D.(1992). The distributed Josephson inductance phase shifter. *Applied Superconductivity. IEEE Transactions on*, 2(1), 33-38.

Hodges, N.E.; Yam, M.H., "A precise analog phase shifter for SHF SATCOM phased arrays," *Gallium Arsenide Integrated Circuit (GaAs IC) Symposium, 1992. Technical Digest 1992., 14th Annual IEEE*, vol., No., pp. 29,32, Oct. 4-7, 1997 doi: 10.1109/GAAS.1992.247230.

Rafique, R., Ohki. T., Linnér. P., & Herr, A. Y. (2009). Niobium tunable microwave filter. *Microwave Theory and Techniques, IEEE Transactions on*,57(5), 1173-1179.

International Search Report for corresponding PCT/US2015/046569, mailed Aug. 12, 2016.

Durand, et al. "The distributed Josephson inductance phase shifter." *IEEE Transactions on applied superconductivity* 2.1 (1992): 33-38.

Kaplunenko, et al. "Josephson junction arrays as a variable inductor in RF circuits and tunable filters." *Superconductor Science and Technology* 17.5 (2004): S145.

Patzelt, et al. "High-temperature superconductive lumped-element microwave allpass sections." *Electronics letters* 29.17 (1993): 1578-1580.

* cited by examiner

SUPERCONDUCTING PHASE-SHIFT SYSTEM

TECHNICAL FIELD

The present invention relates generally to superconducting circuits, and more particularly to a superconducting phase-shift system.

BACKGROUND

Superconducting digital technology has provided computing and/or communications resources that benefit from unprecedented high speed, low power dissipation, and low operating temperature. Many quantum information processing implementations, including superconducting and semiconducting qubits, require signals (e.g., shaped microwave pulses) for both qubit control and readout. Scaling such systems to a useful integration complexity typically requires a toolbox for locally steering and manipulating signals on-chip in a cryogenic environment. As an example, the system can include circuit components for adjusting characteristics of the signals, such as a phase or other characteristics of the signals that implement qubit control and readout. Some variable phase shift devices can be implemented with voltage variable capacitors (i.e., varactors). However, although some varactors are compatible with cryogenic operation, they typically require control voltages that may range from 1-10 volts, which cannot easily be generated by single flux quantum (SFQ) circuits.

SUMMARY

One example includes a superconducting phase-shift system. The system includes an all-pass filter comprising at least one variable inductance element. The all-pass filter can be configured to receive an input signal and to provide the input signal as an output signal that is phase-shifted relative to the input signal based on a variable inductance provided by each of the at least one variable inductance element. The system can further include a phase controller configured to provide a phase-control current to control the variable inductance of the at least one variable inductance element based on a characteristic of the phase-control current.

Another example includes a method for phase-shifting an input signal via an all-pass filter. The method includes receiving the input signal at an input of the all-pass filter. The method also includes providing a phase-control current from a phase controller onto a control line that is inductively coupled to a first variable inductance element that is coupled to the input and to a second variable inductance element that is coupled to an output of the all-pass filter. The method also includes adjusting an amplitude of the phase-control current to control a variable inductance associated with each of the first and second variable inductance elements. The method further includes providing an output signal at the output that is phase-shifted relative to the input signal based on the variable inductance of the first and second variable inductance elements.

Another example includes a superconducting phase-shift system. The system includes an all-pass filter comprising at least one variable inductance element. Each of the at least one variable inductance element can be configured as at least one Superconducting Quantum Interference Device (SQUID) each comprising a pair of Josephson junctions. The all-pass filter can be configured to receive an input signal and to provide the input signal as an output signal that is phase-shifted relative to the input signal based on a variable inductance provided by each of the at least one variable inductance element. The system can further include a phase controller configured to provide a phase-control current at a variable amplitude to control the variable inductance of the at least one variable inductance element. The phase-control current can be inductively coupled to each of the at least one SQUID in each of the at least one variable inductance element.

DETAILED DESCRIPTION

The present disclosure relates generally to superconducting circuits, and more particularly to a superconducting phase-shift system. A superconducting phase-shift system can include an all-pass filter that receives a signal (e.g., a microwave signal) at an input and provides an output signal that is a phase-shifted version of the input signal at an output. The superconducting phase-shift system includes an all-pass filter that includes at least one variable inductance element that can be configured, for example, as a Superconducting Quantum Interference Device (SQUID), such as including a parallel pair of Josephson junctions. As an example, the all-pass filter can include a first variable inductance element coupled to the input and a second variable inductance element that is coupled to the output. The variable inductance element(s) are configured to provide variable inductance to the input signal in generating the phase-shifted output signal in response to a characteristic of a phase-control current. For example, the phase-control current can be generated by a phase controller that provides the phase-control current at an amplitude that is variable to result in the variable inductance. The phase-control current can be inductively coupled to the variable inductance element(s).

As an example, the all-pass filter can include a capacitor that separates the input and the output, and can include a first variable inductance element coupled to the input and a second variable inductance element coupled to the output. The first and second variable inductance elements can each be configured as a pair of SQUIDs that are each inductively coupled to a conductor on which the phase-control current is provided. The SQUIDs can each include a pair of Josephson junctions which can be asymmetric with respect to critical current. Thus, variations in amplitude of the phase-control current can change a magnetic flux associated with each of the SQUIDs (e.g., approximately equally), such that the changes in magnetic flux can provide a variable inductance of the SQUIDs to provide a phase change of the input signal that is received at the input, and which is thus provided at the output of the superconducting phase-shift system.

Figure 1:
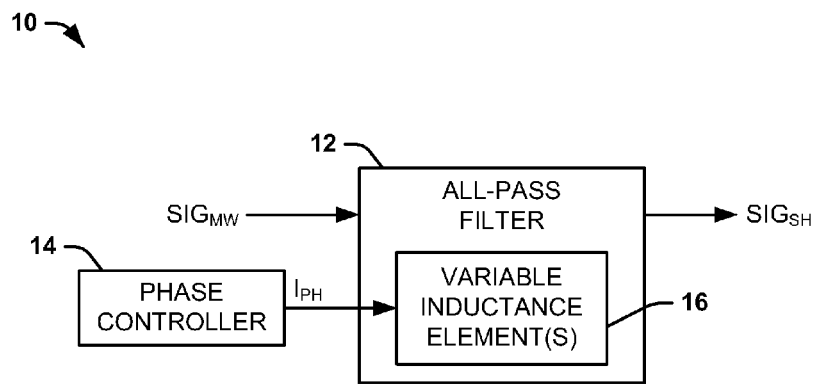
FIG. 1 illustrates an example of a superconducting phase-shift system.

FIG. 1 illustrates an example of a superconducting phase-shift system 10. The superconducting phase-shift system 10 can be implemented in any of a variety of superconducting circuit systems to provide phase-control of an input signal $SIG_{MW}$. As an example, the input signal $SIG_{MW}$ can be a microwave signal that is implemented in a control scheme for a quantum circuit, such as performing a gate or a readout operation on a qubit. As another example, the input signal $SIG_{MW}$ can be a signal pulse or another type of signal. The superconducting phase-shift system 10 provides an output signal $SIG_{SH}$ that can correspond to a phase-shifted version of the input signal $SIG_{MW}$.

The superconducting phase-shift system 10 includes an all-pass filter 12 and a phase controller 14. The all-pass filter 12 is configured to provide a phase-shift of the input signal $SIG_{MW}$, such as in a given range of frequencies of the input signal $SIG_{MW}$. The all-pass filter 12 includes at least one variable inductance element 16 that is responsive to a phase-control current $I_{PH}$ that is generated by the phase controller 14. As an example, the phase-control current $I_{PH}$ is inductively coupled to the variable inductance element(s) 16, such that an amplitude of the phase-control current $I_{PH}$ can control a magnitude of inductance provided by the variable inductance element(s) 16. For example, the phase controller 14 can be configured as a current source (e.g., AC or DC), or as an SFQ pulse generator. The variable inductance element(s) 16 can be coupled to an input and/or an output of the all-pass filter 12, such that the inductance that is provided by the variable inductance element(s) 16 can provide a phase-shift of the input signal $SIG_{MW}$. Thus, the output signal $SIG_{SH}$ can be provided as a phase-shifted version of the input signal $SIG_{MW}$. Furthermore, by varying the amplitude of the phase-control current $I_{PH}$, the inductance provided by the variable inductance element(s) 16 can likewise be varied to adjust the amount of phase-shift provided by the all-pass filter 12 with respect to the input signal $SIG_{MW}$.

As an example, the all-pass filter 12 can include a capacitor that separates an input that receives the input signal $SIG_{MW}$ and an output that provides the output signal $SIG_{SH}$. The variable inductance element(s) 16 can include a first variable inductance element coupled to the input and a second variable inductance element coupled to the output. The first and second variable inductance elements can each be configured as a pair of Superconducting Quantum Interference Devices (SQUIDs) that are each inductively coupled to a conductor on which the phase-control current $I_{PH}$ is provided. The SQUIDs can each include a pair of Josephson junctions that can be asymmetric with respect to critical current. Thus, variations in amplitude of the phase-control current $I_{PH}$ can change a magnetic flux associated with each of the SQUIDs (e.g., approximately equally), such that the changes in magnetic flux can provide a variable inductance of the SQUIDs to provide a phase change of the input signal $SIG_{MW}$ that is received at the input, and which is thus provided as the output signal $SIG_{SH}$ of the superconducting phase-shift system.

Figure 2:
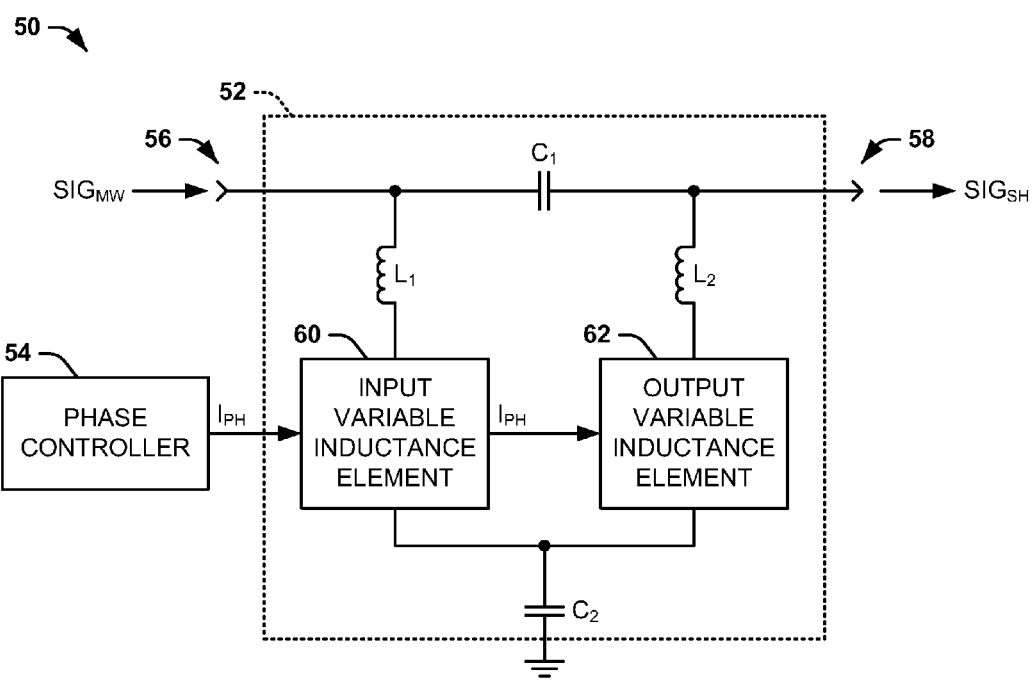
FIG. 2 illustrates another example of a superconducting phase-shift system.

FIG. 2 illustrates another example of a superconducting phase-shift system 50. The superconducting phase-shift system 50 can correspond to the superconducting phase-shift system 10 in the example of FIG. 1, and can thus be implemented in a variety of superconducting circuit systems to provide phase-control of an input signal $SIG_{MW}$ to provide a phase-shifted output signal $SIG_{SH}$.

The superconducting phase-shift system 50 includes an all-pass filter 52 and a phase controller 54. The all-pass filter 52 is configured to provide a phase-shift of the input signal $SIG_{MW}$ that is received at an input 56, such as in a given range of frequencies of the input signal $SIG_{MW}$, to provide the phase-shifted output signal $SIG_{SH}$ from an output 58. In the example of FIG. 2, the input 56 and the output 58 are coupled via a capacitor $C_1$. The all-pass filter 52 includes an input variable inductance element 60 that is coupled to the input 56 via an inductor $L_1$, and an output variable inductance element 62 that is coupled to the output 58 via an inductor $L_2$. A capacitor $C_2$ interconnects the input and output variable inductance elements 60 and 62 to a low-voltage rail, demonstrated in the example of FIG. 2 as ground. The capacitor $C_2$, along with the capacitor $C_1$ and the inductors $L_1$ and $L_2$, is configured to set the characteristics of the all-pass filter 52 (e.g., the center frequency and impedance).

Each of the input and output variable inductance elements 60 and 62 are responsive to a phase-control current $I_{PH}$ that is generated by the phase controller 54. As an example, each of the input and output variable inductance elements 60 and 62 can include at least one SQUID comprising an inductor and a parallel pair of Josephson junctions. For example, the inductor of the at least one SQUID in each of the input and output can be magnetically coupled to an inductor on a control line on which the phase-control current $I_{PH}$ is provided. Therefore, the phase-control current $I_{PH}$ can be inductively coupled to each of the input and output variable inductance elements 60 and 62.

An amplitude of the phase-control current $I_{PH}$ can control a magnitude of inductance provided by the input and output variable inductance elements 60 and 62. For example, by varying the amplitude of the phase-control current $I_{PH}$, the inductance provided by the input and output variable inductance elements 60 and 62 can likewise be varied to adjust the amount of phase-shift provided by the all-pass filter 52 with respect to the input signal $SIG_{MW}$. As an example, the phase-control current $I_{PH}$ can provide a bias current with respect to the parallel pair of Josephson junctions in each of the at least one SQUID in each of the input and output variable inductance elements 60 and 62. Therefore, the phase-control current $I_{PH}$ can be varied to adjust a magnetic flux applied to each of the at least one SQUID in each of the input and output variable inductance elements 60 and 62. Accordingly, the all-pass filter 52 can achieve significant variable phase-shift capability (e.g., up to approximately 90° or more) at a predetermined center frequency of the input signal $SIG_{MW}$, with diminishing phase-shift as the frequency of the input signal $SIG_{MW}$ deviates from the center frequency. The center frequency can be tuned, for example, based on a capacitance of the capacitors $C_1$ and $C_2$ and/or an inductance of each of the inductors $L_1$ and $L_2$. Therefore, the superconducting phase-shift system 50 can be implemented as a compact, lumped-element device to provide phase-shift of a signal (e.g., a microwave signal) based on implementing variable inductance, as opposed to typical phase-shift systems that implement distributed phase-shift elements along the length of a transmission line, or that implement variable capacitance in each of a plurality of stages.

Figure 3:
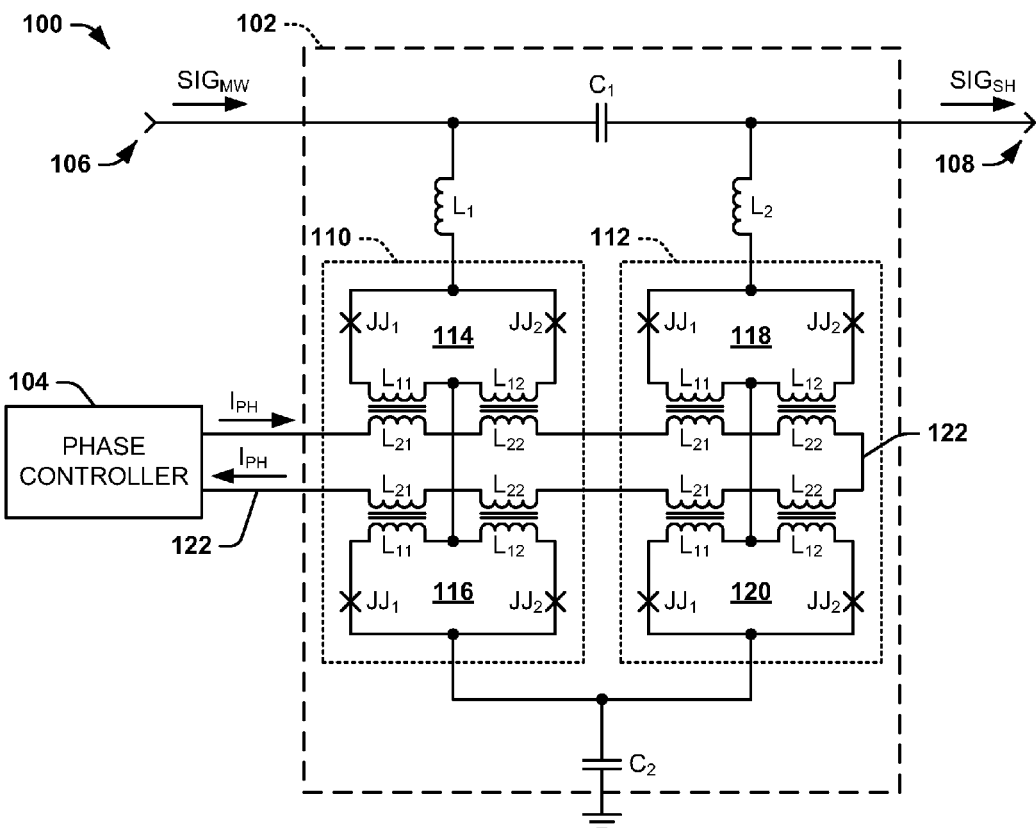
FIG. 3 illustrates an example of a superconducting phase-shift circuit.

FIG. 3 illustrates another example of a superconducting phase-shift system 100. The superconducting phase-shift system 100 can correspond to the superconducting phase-shift system 10 and/or the superconducting phase-shift system 50 in the respective examples of FIGS. 1 and 2, and can thus be implemented in a variety of superconducting circuit systems to provide phase-control of an input signal $SIG_{MW}$ to provide a phase-shifted output signal $SIG_{SH}$.

The superconducting phase-shift system 100 includes an all-pass filter 102 and a phase controller 104. The all-pass filter 102 is configured to provide a phase-shift of the input signal $SIG_{MW}$ that is received at an input 106, such as in a given range of frequencies of the input signal $SIG_{MW}$, to provide the phase-shifted output signal $SIG_{SH}$ from an output 108. In the example of FIG. 3, the input 106 and the output 108 are coupled via a capacitor $C_1$. The all-pass filter 102 includes an input variable inductance element 110 that is coupled to the input 106 via an inductor $L_1$, and an output variable inductance element 112 that is coupled to the output 108 via an inductor $L_2$.

The input variable inductance element 110 is demonstrated in the example of FIG. 3 as a first SQUID 114 and a second SQUID 116 that each include a parallel pair of Josephson junctions $JJ_1$ and $JJ_2$ and a pair of inductors $L_{11}$ and $L_{12}$. The first SQUID 114 is coupled to the inductor $L_1$ and the second SQUID 116 is coupled to a capacitor $C_2$ that interconnects the input and output variable inductance elements 110 and 112 to ground. The first and second SQUIDs 114 and 116 are connected in series via a conductive coupling between the respective inductors $L_{11}$ and $L_{12}$ in each of the first and second SQUIDs 114 and 116. Similarly, the output variable inductance element 112 is demonstrated in the example of FIG. 3 as a first SQUID 118 and a second SQUID 120 that each include a parallel pair of Josephson junctions $JJ_1$ and $JJ_2$ and a pair of inductors $L_{11}$ and $L_{12}$. The first SQUID 118 is coupled to the inductor $L_2$ and the second SQUID 120 is coupled to the capacitor $C_2$. The first and second SQUIDs 118 and 120 are connected in series via a conductive coupling between the respective inductors $L_{11}$ and $L_{12}$ in each of the first and second SQUIDs 118 and 120.

The phase controller 104 is configured to generate a phase-control current $I_{PH}$ on a control line 122 that includes a plurality of inductors $L_{21}$ and $L_{22}$. Each of the inductors $L_{21}$ is magnetically coupled with a respective inductor $L_{11}$ in each of the four SQUIDs 114, 116, 118, and 120, and each of the inductors $L_{22}$ is magnetically coupled with a respective inductor $L_{12}$ in each of the four SQUIDs 114, 116, 118, and 120. Therefore, the phase-control current $I_{PH}$ is inductively coupled to each of the SQUIDs 114, 116, 118, and 120, such that the phase-control current $I_{PH}$ induces a bias current in each of the SQUIDs 114, 116, 118, and 120. As a result, each of the SQUIDs 114, 116, 118, and 120 exhibit a magnetic flux in response to the phase-control current $I_{PH}$. Accordingly, an amplitude of the phase-control current $I_{PH}$ can control a magnitude of inductance provided by the input and output variable inductance elements 110 and 112. For example, by varying the amplitude of the phase-control current $I_{PH}$, the inductance provided by each of the SQUIDs 114, 116, 118, and 120, and thus each of the input and output variable inductance elements 110 and 112, can likewise be varied to adjust the amount of phase-shift provided by the all-pass filter 102 with respect to the input signal $SIG_{MW}$.

Figure 4:
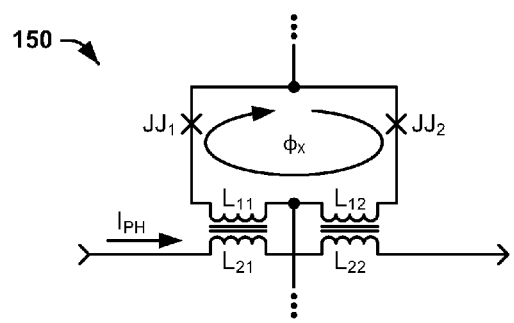
FIG. 4 illustrates an example diagram of a Superconducting Quantum Interference Device (SQUID).

FIG. 4 illustrates an example diagram of a SQUID 150. The SQUID 150 can correspond to one of the SQUIDs 114, 116, 118, and 120 in the example of FIG. 3. Thus, reference is to be made to the example of FIG. 3 in the following description of the example of FIG. 4.

The SQUID 150 includes the parallel pair of Josephson junctions $JJ_1$ and $JJ_2$, as well as the inductors $L_{11}$ and $L_{12}$ that are magnetically coupled to the inductors $L_{21}$ and $L_{22}$ that are provided on the conductor on which the phase-control current $I_{PH}$ is provided. Therefore, the phase-control current $I_{PH}$ can provide a bias current with respect to the parallel pair of Josephson junctions $JJ_1$ and $JJ_2$ in the SQUID 150. Thus, the Josephson junctions $JJ_1$ and $JJ_2$ and the inductors $L_{11}$ and $L_{12}$ are enclosed in a loop having a linear inductance due to the inductors $L_{11}$ and $L_{12}$ that is smaller than the inductance due to the Josephson junctions $JJ_1$ and $JJ_2$. In the example of FIG. 4, the SQUID 150 encloses a magnetic flux $\Phi_X$ that is supplied to the SQUID 150 via the mutually-coupled flux-line (e.g., the control line 122) carrying the phase-control current $I_{PH}$. As an example, the parallel pair of Josephson junctions $JJ_1$ and $JJ_2$ can be asymmetric with respect to each other, such that one of the Josephson junctions $JJ_1$ and $JJ_2$ has a greater critical current than the other.

For example, the Josephson junction $JJ_1$ can have a critical current of approximately 1.5 μA and the Josephson junction $JJ_2$ can have a critical current of approximately 2.5 μA. Therefore, a total critical current of the SQUID 150 can depend on the magnetic flux $\Phi_X$ in a periodic fashion, with the total critical current remaining greater than zero in response to the magnetic flux $\Phi_X$ being approximately equal to a flux quantum $\Phi_0$ divided by two based on asymmetric critical currents of the Josephson junctions $JJ_1$ and $JJ_2$. For example, based on the above example critical currents of the respective Josephson junctions $JJ_1$ and $JJ_2$, the total critical current of the SQUID 150 can vary between approximately 4 μA at a maximum and approximately 1 μA at a minimum, such as to provide an inductance from a minimum of approximately 82 pH at $\Phi_x=0$ to a maximum of approximately 330 pH at $\Phi_x=\Phi_0/2$.

The superconducting phase-shift system 100 and the SQUID 150 demonstrated in the respective examples of FIGS. 3 and 4 provide an example of an all-pass filter-based phase-shift system for a signal that implements variable inductance in a compact lumped-element arrangement. It is to be understood that the superconducting phase-shift system 100 is not limited to the example of FIG. 3. As an example, while the example of FIG. 3 demonstrates four SQUIDs 114, 116, 118, and 120, the all-pass filter 102 could instead include a different number of SQUIDs in each of the input and output variable inductance elements 110 and 112. For example, each of the input and output variable inductance elements 110 and 112 could instead include a single SQUID, or could include multiple SQUIDs or SQUID pairs, such as operating based on different respective phase-control currents. Additionally, the superconducting phase-shift system 100 could include a different arrangement of filter elements with respect to the capacitor $C_1$ and the inductors $L_1$ and $L_2$ (e.g., can omit the inductors $L_1$ and $L_2$). Therefore, the superconducting phase-shift system 100 can be configured in a variety of different ways.

Figure 5:
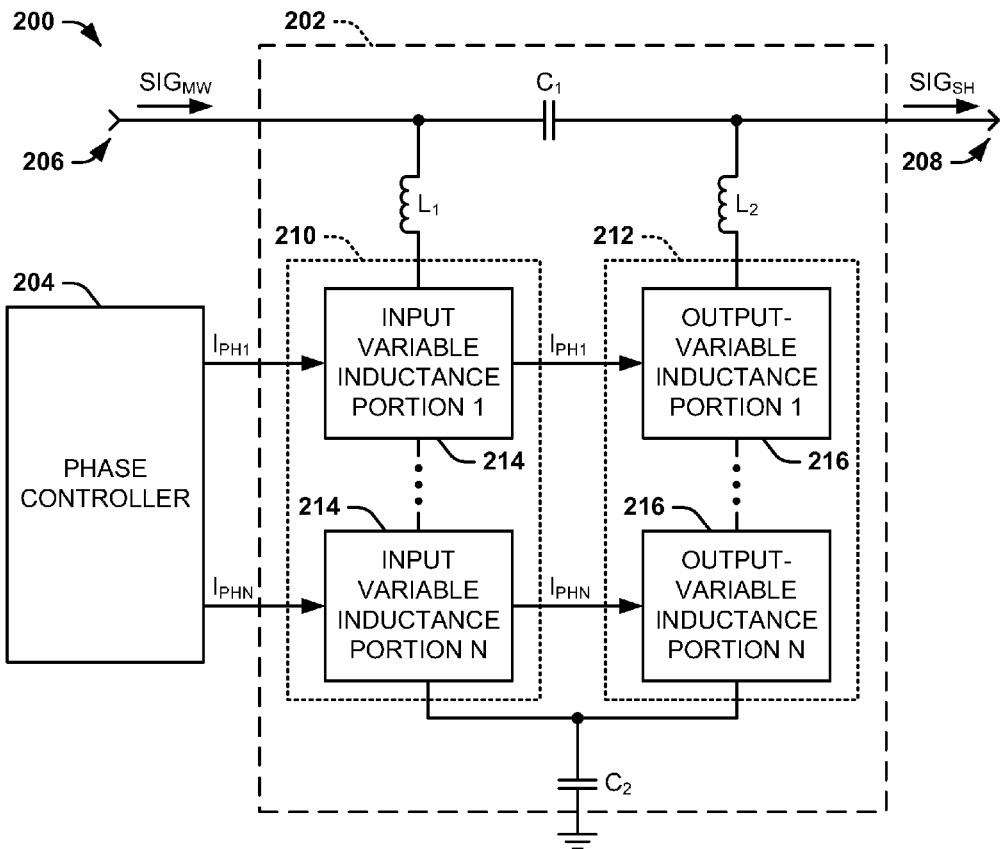
FIG. 5 illustrates yet another example of a superconducting phase-shift system.

FIG. 5 illustrates yet another example of a superconducting phase-shift system 200. The superconducting phase-shift system 200 can correspond to the superconducting phase-shift system 10 in the example of FIG. 1, and can thus be implemented in a variety of superconducting circuit systems to provide phase-control of an input signal $SIG_{MW}$ to provide a phase-shifted output signal $SIG_{SH}$.

The superconducting phase-shift system 200 includes an all-pass filter 202 and a phase controller 204. The all-pass filter 202 is configured to provide a phase-shift of the input signal $SIG_{MW}$ that is received at an input 206, such as in a given range of frequencies of the input signal $SIG_{MW}$, to provide the phase-shifted output signal $SIG_{SH}$ from an output 208. In the example of FIG. 5, the input 206 and the output 208 are coupled via a capacitor $C_1$. The all-pass filter 202 includes an input variable inductance element 210 that is coupled to the input 206 via an inductor $L_1$, and an output variable inductance element 212 that is coupled to the output 208 via an inductor $L_2$. A capacitor $C_2$ interconnects the input and output variable inductance elements 210 and 212 to a low-voltage rail, demonstrated in the example of FIG. 5 as ground. In the example of FIG. 5, the input variable inductance element 210 includes a plurality N of input variable inductance portions 214, and the output variable inductance element 212 includes a plurality N of output variable inductance portions 216, where N is a positive integer greater than one. Each of the input variable inductance portions 214 and each respective one of the output variable inductance portions 216 is responsive to one of a respective plurality N of phase-control currents $I_{PH1}$ through $I_{PHN}$ that is generated by the phase controller 204.

As an example, each of the input and output variable inductance portions 214 and 216 can include at least one SQUID comprising an inductor and a parallel pair of Josephson junctions. For example, each of the input and output variable inductance portions 214 and 216 can include a pair of SQUIDs, such as similar to the example of FIG. 3, that are each inductively coupled to the respective one of the plurality of phase-control currents $I_{PH1}$ through $I_{PHN}$. As a result, each of the phase-control currents $I_{PH1}$ through $I_{PHN}$ can provide separate and individual control over the amount of inductance that is provided by the respective input and output variable inductance portions 214 and 216, and thus the input and output variable inductance elements 210 and 212. For example, each of the input variable inductance portions 214 and each of the output variable inductance portions 216 can be configured uniquely with respect to the other respective input and output variable inductance portions 214 and 216. Therefore, all-pass filter 202 of the superconducting phase-shift system 200 can provide more control of the phase-shift of the input signal $SIG_{MW}$. For example, the all-pass filter 202 can provide fine and coarse setting of the phase-shift of the input signal $SIG_{MW}$ via the phase-control currents $I_{PH1}$ through $I_{PHN}$, or can provide incremental binary adjustments to the phase-shift, or any of a variety of other types of adjustments to the phase-shift of the input signal $SIG_{MW}$.

Figure 6:
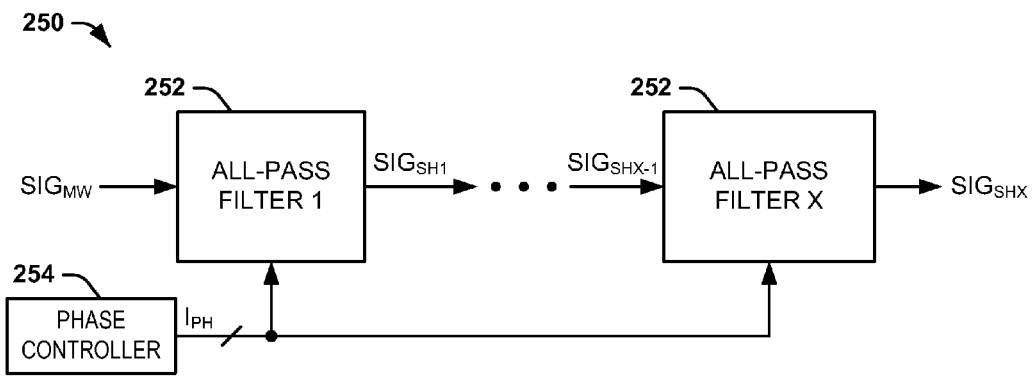
FIG. 6 illustrates yet a further example of a superconducting phase-shift system.

FIG. 6 illustrates yet a further example of a superconducting phase-shift system 250. The superconducting phase-shift system 250 includes a plurality X of all-pass filters 252 and a phase controller 254, where X is a positive integer greater than one. As an example, each of the all-pass filters 252 can be configured substantially similar to the all-pass filter 52, the all-pass filter 102, or the all-pass filter 202 in the respective examples of FIG. 2, 3, or 5. The plurality of all-pass filters 252 are thus each configured to provide a respective phase-shift of an input signal $SIG_{MW}$, such as in a given range of frequencies of the input signal $SIG_{MW}$. In the example of FIG. 6, each of the all-pass filters 252 provides a separate contribution of phase-shift to provide the output signal $SIG_{SH}$ corresponding to a phase-shifted version of the input signal $SIG_{MW}$.

In the example of FIG. 6, each of the all-pass filters 252 is controlled by a phase-control current $I_{PH}$ that is generated by the phase controller 254. As an example, the phase-control current $I_{PH}$ can include a single current that is inductively coupled to variable inductance elements in each of the all-pass filters 252, or can be a separate and independent current that is inductively coupled to at least one variable inductance element a respective one of the all-pass filters 252. Thus, a first of the all-pass filters 252 provides a first phase-shift of the input signal $SIG_{MW}$ received at an input of the first of the all-pass filters 252 to provide a signal $SIG_{SH1}$ at an output of the first of the all-pass filters 252. Subsequently, a next one of the all-pass filters 252 provides a phase-shift of the signal $SIG_{SH1}$ received at an input of the next of the all-pass filters 252 to provide a signal at an output of the next of the all-pass filters 252 that is further phase-shifted, up to a last of the all-pass filters 252 (i.e., the Xth all-pass filter 252) providing a phase-shift of a signal $SIG_{SHX-1}$ received at an input of the last of the all-pass filters 252 to provide the phase-shifted signal $SIG_{SHX}$ at an output of the last of the all-pass filters 252. Therefore, each of the all-pass filters 252 can provide separate amounts of cumulative phase-shift of the input signal $SIG_{MW}$ to achieve any amount of desired phase-shift in providing the output signal $SIG_{SHX}$.

Figure 7:
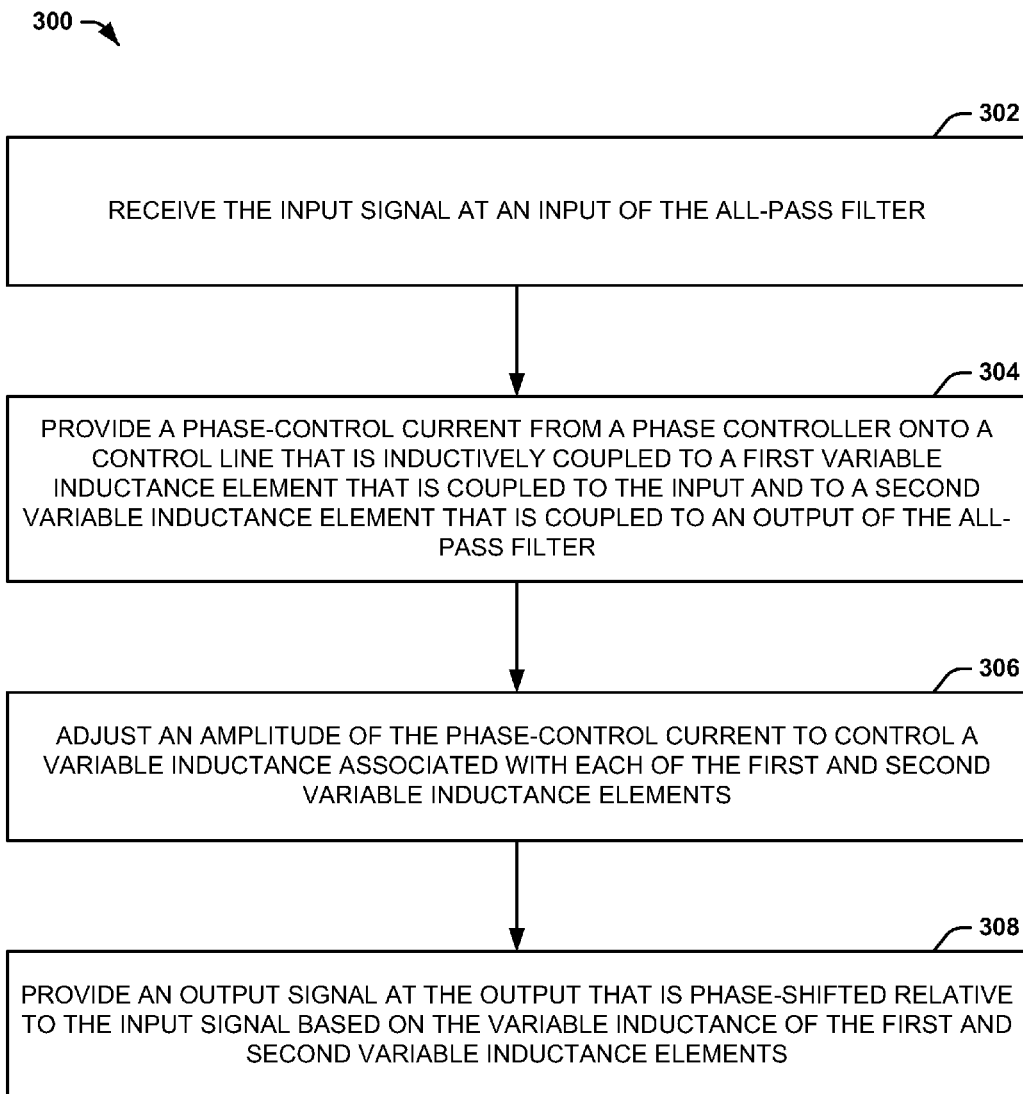
FIG. 7 illustrates an example of method for phase-shifting an input signal via an all-pass filter.

In view of the foregoing structural and functional features described above, a methodology in accordance with various aspects of the present invention will be better appreciated with reference to FIG. 7. While, for purposes of simplicity of explanation, the methodology of FIG. 7 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 7 illustrates a method 300 for method for phase-shifting an input signal (e.g., the input signal $SIG_{MW}$) via an all-pass filter (e.g., the all-pass filter 12). At 302, the input signal is received at an input (e.g., the input 56) of the all-pass filter. At 304, a phase-control current (e.g., the phase-control current $I_{PH}$) is provided from a phase controller (e.g., the phase controller 14) onto a control line (e.g., the control line 122) that is inductively coupled to a first variable inductance element (e.g., the input variable inductance element 60) that is coupled to the input and to a second variable inductance element (e.g., the output variable inductance element 62) that is coupled to an output (e.g., the output 58) of the all-pass filter. At 306, an amplitude of the phase-control current is adjusted to control a variable inductance associated with each of the first and second variable inductance elements. At 308, an output signal (e.g., the output signal $SIG_{SH}$) is provided at the output that is phase-shifted relative to the input signal based on the variable inductance of the first and second variable inductance elements.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:
1. A superconducting phase-shift system comprising:
an all-pass filter comprising at least one variable inductance element comprising at least one Superconducting Quantum Interference Device (SQUID), the all-pass filter being configured to receive an input signal and to provide the input signal as an output signal that is phase-shifted relative to the input signal based on a variable inductance provided by each of the at least one variable inductance element; and
a phase controller configured to provide a phase-control current to control the variable inductance of the at least one variable inductance element based on a characteristic of the phase-control current.

2. The system of claim 1, wherein the at least one variable inductance element is configured as a flux-controlled variable inductor that provides the variable inductance as a function of magnetic flux based on an amplitude of the phase-control current.

3. The system of claim 1, wherein the at least one SQUID comprises a parallel pair of Josephson junctions that are biased based on the phase-control current via an inductive coupling.

4. The system of claim 3, wherein the parallel pair of Josephson junctions are configured to have asymmetrical critical currents with respect to each other.

5. The system of claim 1, wherein each of the at least one variable inductance element comprises:
a first Superconducting Quantum Interference Device (SQUID) coupled to one of an input and an output of the all-pass filter and comprising a first parallel pair of Josephson junctions interconnecting the one of the input and the output and an inductive coupling to the phase-control current to provide a bias current to the first parallel pair of Josephson junctions; and
a second SQUID coupled to a capacitor interconnecting the second SQUID and a low-voltage rail, the second SQUID comprising a second parallel pair of Josephson junctions interconnecting the capacitor and an inductive coupling to the phase-control current to provide a bias current to the second parallel pair of Josephson junctions, wherein the first SQUID and the second SQUID are connected in series via the inductive couplings.

6. The system of claim 5, wherein the first and second parallel pairs of Josephson junctions each have asymmetrical critical currents with respect to each other.

7. The system of claim 5, wherein the at least one variable inductance element comprises:
a first variable inductance element that interconnects an input of the all-pass filter and a first capacitor that is coupled to a low-voltage rail; and
a second variable inductance element that interconnects an output of the all-pass filter and the first capacitor, wherein the input and the output are separated by a second capacitor across which the input signal is provided as the output signal.

8. The system of claim 1, wherein each of the at least one variable inductance element comprises a plurality of variable inductance portions in a cascaded arrangement between one of an input and an output of the all-pass filter and a capacitor that is coupled to a low-voltage rail, wherein each of the plurality of variable inductance portions provides a separate and independent contribution to the variable inductance in response to an amplitude of a respective one of a plurality of phase-control currents provided from the phase controller.

9. The system of claim 1, wherein the all pass-filter element is a first all-pass filter configured to provide a first phase-shift of the input signal, the system further comprising at least one additional all-pass filter coupled in series to the first all-pass filter, each of the at least one additional all-pass filter comprising at least one variable inductance element and being configured to provide additional phase-shift of the input signal in providing the output signal based on a variable inductance provided by each of the at least one variable inductance element.

10. A superconducting phase-shift system comprising:
an all-pass filter comprising at least one variable inductance element, the all-pass filter being configured to receive an input signal and to provide the input signal as an output signal that is phase-shifted relative to the input signal based on a variable inductance provided by each of the at least one variable inductance element, wherein the at least one variable inductance element comprises:
a first variable inductance element that interconnects an input of the all-pass filter and a first capacitor that is coupled to a low-voltage rail; and
a second variable inductance element that interconnects an output of the all-pass filter and the first capacitor, wherein the input and the output are separated by a second capacitor across which the input signal is provided as the output signal; and
a phase controller configured to provide a phase-control current to control the variable inductance of the at least one variable inductance element based on a characteristic of the phase-control current.

11. The system of claim 10, wherein each of the first and second variable inductance elements comprises an inductive coupling to receive the phase-control current to provide an approximately equal variable inductance with respect to each other.

12. A method for phase-shifting an input signal via an all-pass filter, the method comprising:
receiving the input signal at an input of the all-pass filter;
providing a phase-control current from a phase controller onto a control line that is inductively coupled to a first variable inductance element that is coupled to the input and to a second variable inductance element that is coupled to an output of the all-pass filter;
adjusting an amplitude of the phase-control current to control a variable inductance associated with each of the first and second variable inductance elements; and
providing an output signal at the output that is phase-shifted relative to the input signal based on the variable inductance of the first and second variable inductance elements.

13. The method of claim 12, wherein each of the first and second variable inductance elements comprises at least one Superconducting Quantum Interference Device (SQUID) comprising a parallel pair of Josephson junctions, wherein providing the phase-control current comprises providing the phase-control current onto the control line to induce a magnetic flux in the SQUID.

14. The method of claim 13, wherein the parallel pair of Josephson junctions are configured to have asymmetrical critical currents with respect to each other.

15. The method of claim 12, wherein providing the phase-control current comprises providing the phase-control current from a phase controller onto a control line that is inductively coupled to a first Superconducting Quantum Interference Device (SQUID) that is coupled to the input and to a second SQUID that is coupled to the output, wherein each of the first SQUID and the second SQUID comprises a parallel pair of Josephson junctions that are biased by the phase-control current.

16. The method of claim 12, wherein providing the phase-control current comprises providing a plurality of phase-control currents to a each of a first respective plurality of variable inductance portions in a cascaded arrangement between the input and a capacitor that is coupled to a low-voltage rail and to each of a second respective plurality of variable inductance portions in a cascaded arrangement between the output and the capacitor, wherein each of the first and second pluralities of variable inductance portions provides a separate and independent contribution to the variable inductance in response to an amplitude of a respective one of a plurality of phase-control currents provided from the phase controller.

17. A superconducting phase-shift system comprising:
an all-pass filter comprising at least one variable inductance element, each of the at least one variable inductance element being configured as at least one Superconducting Quantum Interference Device (SQUID) each comprising a pair of Josephson junctions, the all-pass filter being configured to receive an input signal and to provide the input signal as an output signal that is phase-shifted relative to the input signal based on a variable inductance provided by each of the at least one variable inductance element; and
a phase controller configured to provide a phase-control current at a variable amplitude to control the variable inductance of the at least one variable inductance element, the phase-control current being inductively coupled to each of the at least one SQUID in each of the at least one variable inductance element.

18. The system of claim 17, wherein the at least one variable inductance element comprises:
a first variable inductance element that interconnects an input of the all-pass filter and a first capacitor that is coupled to a low-voltage rail; and
a second variable inductance element that interconnects an output of the all-pass filter and the first capacitor, wherein the input and the output are separated by a second capacitor across which the input signal is provided as the output signal.

19. The system of claim 17, wherein the parallel pair of Josephson junctions in each of the at least one SQUID have asymmetrical critical currents with respect to each other.

20. The system of claim 17, wherein each of the at least one variable inductance element comprises a plurality of variable inductance portions in a cascaded arrangement between one of an input and an output of the all-pass filter and a capacitor that is coupled to a low-voltage rail, wherein each of the plurality of variable inductance portions comprises at least one SQUID, wherein each of the plurality of variable inductance portions provides a separate and independent contribution to the variable inductance in response to an amplitude of a respective one of a plurality of phase-control currents provided from the phase controller.

* * * * *